(12) United States Patent
Yonemoto et al.

(10) Patent No.: US 6,801,253 B1
(45) Date of Patent: Oct. 5, 2004

(54) SOLID-STATE IMAGE SENSOR AND METHOD OF DRIVING SAME

(75) Inventors: Kazuya Yonemoto, Tokyo (JP); Ryoji Suzuki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/037,975

(22) Filed: Mar. 9, 1998

(30) Foreign Application Priority Data

Mar. 10, 1997 (JP) .......................................... P09-054356
Aug. 15, 1997 (JP) .......................................... P09-220265
Sep. 26, 1997 (JP) .......................................... P09-261208

(51) Int. Cl.$^7$ ......................... H04N 5/217; H04N 5/335; H01L 27/00
(52) U.S. Cl. ....................... 348/241; 348/302; 348/308; 348/312; 250/208.1
(58) Field of Search .............................. 348/300, 302, 348/304, 308, 312, 241; 250/208.1

(56) References Cited

U.S. PATENT DOCUMENTS

| | | | | |
|---|---|---|---|---|
| 4,556,910 A | * | 12/1985 | Tisue ............................ | 348/241 |
| 4,942,474 A | * | 7/1990 | Akimoto et al. .............. | 348/301 |
| 5,471,515 A | * | 11/1995 | Fossum et al. ................ | 377/60 |
| 5,793,423 A | * | 8/1998 | Hamasaki ..................... | 348/300 |
| 5,926,214 A | * | 7/1999 | Denyer et al. ............... | 348/241 |
| 5,955,753 A | * | 9/1999 | Takahashi ..................... | 257/292 |
| 6,239,839 B1 | * | 5/2001 | Mastunaga et al. .......... | 348/241 |
| 2001/0012070 A1 | * | 8/2001 | Enod et al. .................. | 348/302 |

* cited by examiner

*Primary Examiner*—Wendy R. Garber
*Assistant Examiner*—Lin Ye
(74) *Attorney, Agent, or Firm*—Sonnenschein, Nath & Rosenthal LLP

(57) ABSTRACT

An amplifying type solid-state image sensor comprises, in each of unit pixels arrayed to form a matrix of rows and columns, a photoelectric conversion element, an amplifying element having a storage to store a signal charge transferred thereto from the photoelectric conversion element and serving to convert the signal charge of the storage into an electric signal, and a selector switch for selectively outputting the pixel signal from the amplifying element to a vertical signal line. The image sensor further comprises a reset circuit in each of the unit pixels for resetting the storage of each amplifying element every time a pixel signal is outputted from the pixel. A pre-reset signal and a post-reset signal are delivered from each unit pixel and then are transferred via a common path, and the difference between such signals is taken to suppress not only the fixed pattern noise derived from characteristic deviation in each unit pixel but also vertically correlated fixed pattern noises of vertical streaks.

7 Claims, 12 Drawing Sheets

STORAGE STATE

READ STATE

FD RESET STATE

OVERFLOW STATE

SOLID-STATE IMAGE SENSOR AND METHOD OF DRIVING SAME

BACKGROUND OF THE INVENTION

1. Field of the Invention

The present invention relates to a solid-state image sensor and a method of driving the same, and more particularly to an amplifying type solid-state imaging device such as a MOS image sensor where unit pixels each having an amplifying function are arrayed in the form of a matrix of rows and columns, and also to a method of driving such an image sensor.

2. Description of the Related Art

FIG. 13 shows an exemplary structure of a conventional amplifying type solid-state image sensor known heretofore in the related art. In this diagram, a unit pixel 106 is composed of a photodiode 101, an FD (floating diffusion) read MOS transistor 102, an FD amp MOS transistor 103, an FD reset MOS transistor 104, and a vertical select MOS transistor 105. In this structure, a gate electrode of the FD read MOS transistor 102 is connected to a vertical read line 107, a gate electrode of the FD reset MOS transistor 104 to a vertical reset line 108, a gate electrode of the vertical select MOS transistor 105 to a vertical select line 109, and a source electrode of the vertical select MOS transistor 105 to a vertical signal line 110, respectively.

A horizontal select MOS transistor 112 is connected between one end of the vertical signal line 110 and a horizontal signal line 111. The operation of each pixel is controlled per row by three kinds of vertical scanning pulses $\phi VS_n$, $\phi VT_n$, and $\phi VR_n$ outputted from a row-select vertical scanning circuit 113, and a pixel signal is outputted to the horizontal signal line 111 via the horizontal select MOS transistor 112 which is controlled by a horizontal scanning pulse $\phi H_m$ outputted from a column-select horizontal scanning circuit 114. At this time, the signal charge stored in the photodiode 101 through photoelectric conversion is converted into a signal current by the FD amp MOS transistor 103 and then is delivered as an output signal of the image sensor.

However, in the known amplifying type solid-state image sensor of the above structure, there exists a problem of characteristic deviation in the active elements constituting each pixel, principally in the FD amp MOS transistor 103, and particularly relative to deviation of the threshold voltage Vth of the MOS transistor. And such deviation is included directly in the output signal of the image sensor. Since this characteristic deviation has a fixed value per pixel, it appears as a fixed pattern noise (FPN) in the picture displayed on a screen. For suppressing such fixed pattern noise, it is necessary to externally connect to the device a noise elimination circuit using a frame memory or a line memory, so as to eliminate any noise component derived from the characteristic deviation in the pixel. As a result, the scale of the camera system is rendered larger correspondingly to the noise elimination circuit connected thereto externally.

In comparison with the above, there is contrived another amplifying type solid-state image sensor which has a structure of FIG. 14 and is capable of internally suppressing such fixed pattern noise in the device. The difference of this solid-state image sensor resides in the point that, although its unit pixel 106 is structurally the same as FIG. 13, a horizontal output circuit 115 is provided for suppressing the fixed pattern noise derived from the characteristic deviation in the pixel 106, and this horizontal output circuit 115 executes a process of taking the difference between pre-read and post-read (pre-reset and post-reset) signals of the pixel 106.

In FIG. 14, a load MOS transistor 116 serving as a load to the source follower operation of an FD amp MOS transistor 103 is connected between a vertical signal line 110 and the ground. Further, one main electrode of each of paired signal switch MOS transistors 117 and 117' is connected to the vertical signal line 110. And a pair of signal holding capacitors 118 and 118' are connected respectively between the ground and the other main electrodes of such paired signal switch MOS transistors 117 and 117'.

Further a pair of horizontal select MOS transistors 112 and 112' are connected respectively between the other main electrodes of the paired signal switch MOS transistors 117, 117' and a pair of horizontal signal lines 111, 111'. And a noninverting (+) input terminal and an inverting (−) input terminal of a differential amplifier 119 are connected respectively to the pair of horizontal signal lines 111 and 111'.

In the amplifying type solid-state image sensor of the above structure, pixel pre-reset and post-reset signals are held respectively in signal holding capacitors 118, 118' via the signal switch MOS transistors 117, 117' and then are supplied to the differential amplifier 119 via the horizontal select MOS transistors 112, 112' and the horizontal signal lines 111, 111'. Subsequently, the difference between the pixel pre-reset and post-reset signals is taken in the differential amplifier 119 to thereby eliminate the fixed pattern noise derived from the characteristic deviation in each unit pixel.

Although it is possible in the amplifying type solid-state image sensor of the above structure to suppress the fixed pattern noise derived from the characteristic deviation in each unit pixel, the pixel pre-reset and post-reset signals reach the differential amplifier 119 via separate signal paths, so that the characteristic deviations relative to the paired signal switch MOS transistors 117, 117' and the paired horizontal select MOS transistors 112, 112' appear in the picture as fixed pattern noises with vertically correlated streaks. Therefore, this structure also requires an external correction circuit for suppressing the fixed pattern noises with vertical streaks.

SUMMARY OF THE INVENTION

It is an object of the present invention to provide an improved amplifying type solid-state image sensor which is capable of suppressing, within the device, any fixed pattern noise derived from characteristic deviation in each unit pixel and also other fixed pattern noise of vertical streaks.

And another object of the invention is to provide a method of driving such an image sensor.

According to one aspect of this invention, there is provided a solid-state image sensor which comprises, in each of unit pixels arrayed to form a matrix of rows and columns, a photoelectric conversion element, an amplifying element having a storage to store a signal charge transferred thereto from the photoelectric conversion element and serving to convert the signal charge of the storage into an electric signal, and a selector switch for selectively outputting the pixel signal from the amplifying element to a vertical signal line. The image sensor further comprises, in each of the unit pixels, a reset circuit for resetting the storage of each amplifying element every time a pixel signal is outputted from each unit pixel.

According to another aspect of this invention, there is provided a method of driving a solid-state image sensor having the above structure. The method comprises the steps of resetting the storage of each amplifying element every time a pixel signal is outputted from each of the unit pixels; then delivering a pre-reset signal and a post-reset signal from each unit pixel and transferring such signals via a common transfer path; and taking the difference between the pre-reset signal and the post-reset signal.

In each of the unit pixels constituting the solid-state image sensor of the structure described above, the storage of each amplifying element is reset every time a pixel signal is outputted, so that a pre-reset signal and a post-reset signal per pixel are outputted successively from each of the unit pixels. In this case, fixed pattern noise derived from any characteristic deviation in the pixel is generated as an offset component from the amplifying element of each pixel. Therefore, the noise component can be canceled by taking the difference between the pre-reset signal and the post-reset signal. Since the pre-reset and post-reset signals are outputted from a vertical signal line to a horizontal signal line via a common signal path, fundamentally none of vertically correlated streak noise components is generated.

The above and other features and advantages of the present invention will become apparent from the following description which will be given with reference to the illustrative accompanying drawings.

DESCRIPTION OF THE PREFERRED EMBODIMENTS

Hereinafter some preferred embodiments of the present invention will be described in detail with reference to the accompanying drawings.

Figure 1:
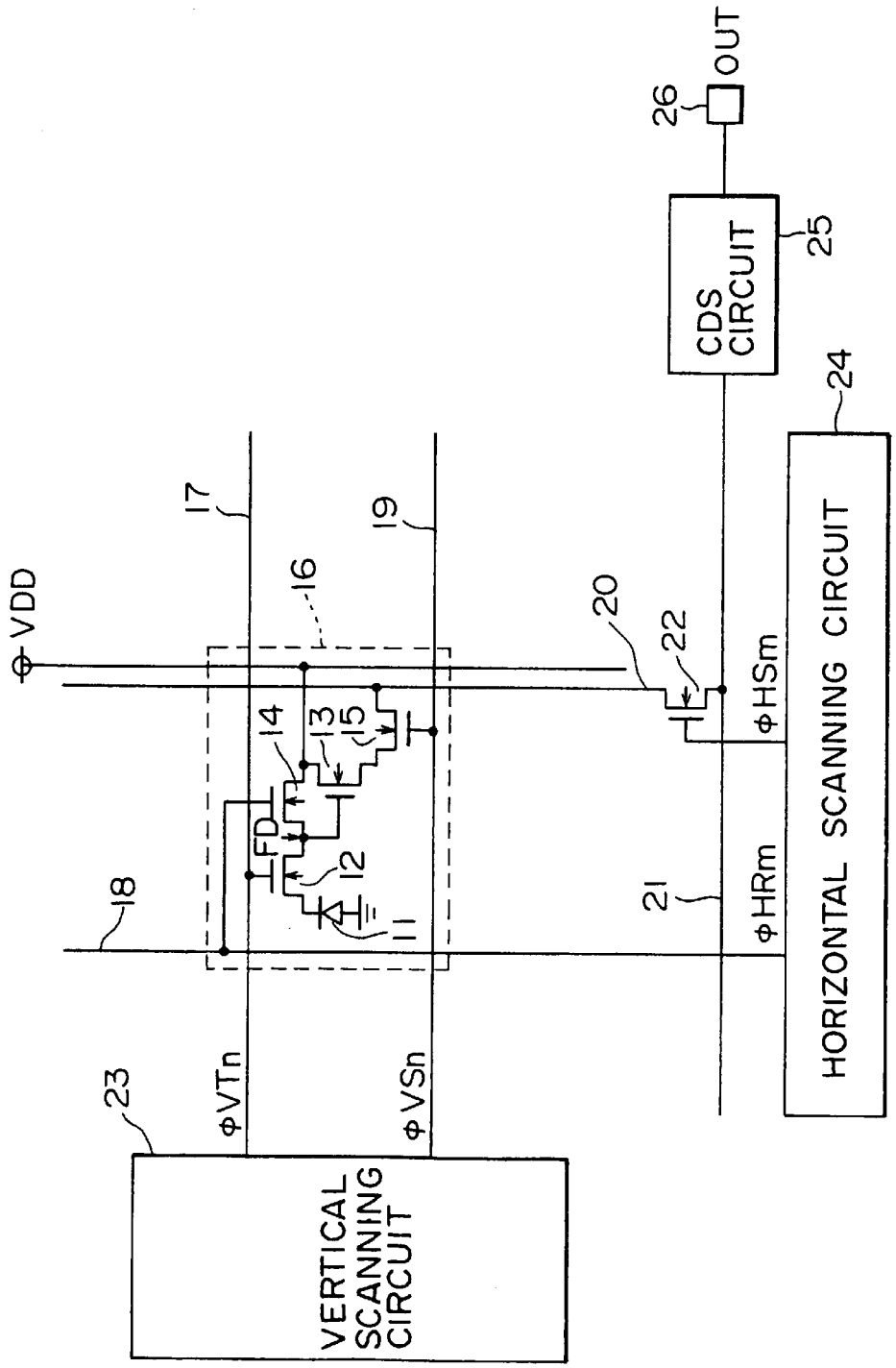
FIG. 1 is a block diagram showing the structure of a first embodiment of the present invention.

FIG. 1 is a block diagram showing the structure of a first embodiment of the present invention. In this diagram, a unit pixel 16 is composed of a photodiode 11 as a photoelectric conversion element, an FD read MOS transistor 12, an FD amp MOS transistor 13 as an amplifying element, an FD reset MOS transistor 14, and a vertical select MOS transistor 15 as a select element. Entire unit pixels are arrayed two dimensionally to form a matrix of rows and columns. In order to simplify the diagram, merely one unit pixel 16 (nth row, mth column) is shown here.

In this unit pixel 16, a gate electrode of the FD read MOS transistor 12 is connected to a vertical read line 17, a gate electrode of the FD reset MOS transistor 14 to a horizontal reset line 18, a gate electrode of the vertical select MOS transistor 15 to a vertical select line 19, and a source electrode of the vertical select MOS transistor 15 to a vertical signal line 20, respectively. And a horizontal select MOS transistor 22 is connected between one end of the vertical signal line 20 and a horizontal signal line 21.

Further a row-select vertical scanning circuit 23 and a column-select horizontal scanning circuit 24 are provided. A vertical read scanning pulse $\phi VT_n$, outputted from the vertical scanning circuit 23 is applied to the vertical read line 17, and a vertical select scanning pulse $\phi VS_n$, to the vertical select line 19, respectively. A horizontal reset pulse $\phi HR_m$, outputted from the horizontal scanning circuit 24 is applied to the horizontal reset line 18, and a horizontal select scanning pulse $\phi HS_m$, to the gate electrode of the horizontal select MOS transistor 22, respectively. Thus, the circuit configuration is simplified since the horizontal scanning circuit 24 serves also as a reset circuit which generates a horizontal reset pulse $\phi HR_m$.

A correlated double sampling circuit (hereinafter referred to as CDS circuit) 25 of a simple configuration is provided at the output end of the horizontal signal line 21 to serve as a differential circuit which takes the difference between pixel pre-reset and post-reset signals. A concrete configuration of this CDS circuit 25 will be explained later in detail together with its operation. The output end of the CDS circuit 25 is connected to an output terminal 26 of the image sensor.

Figure 2:
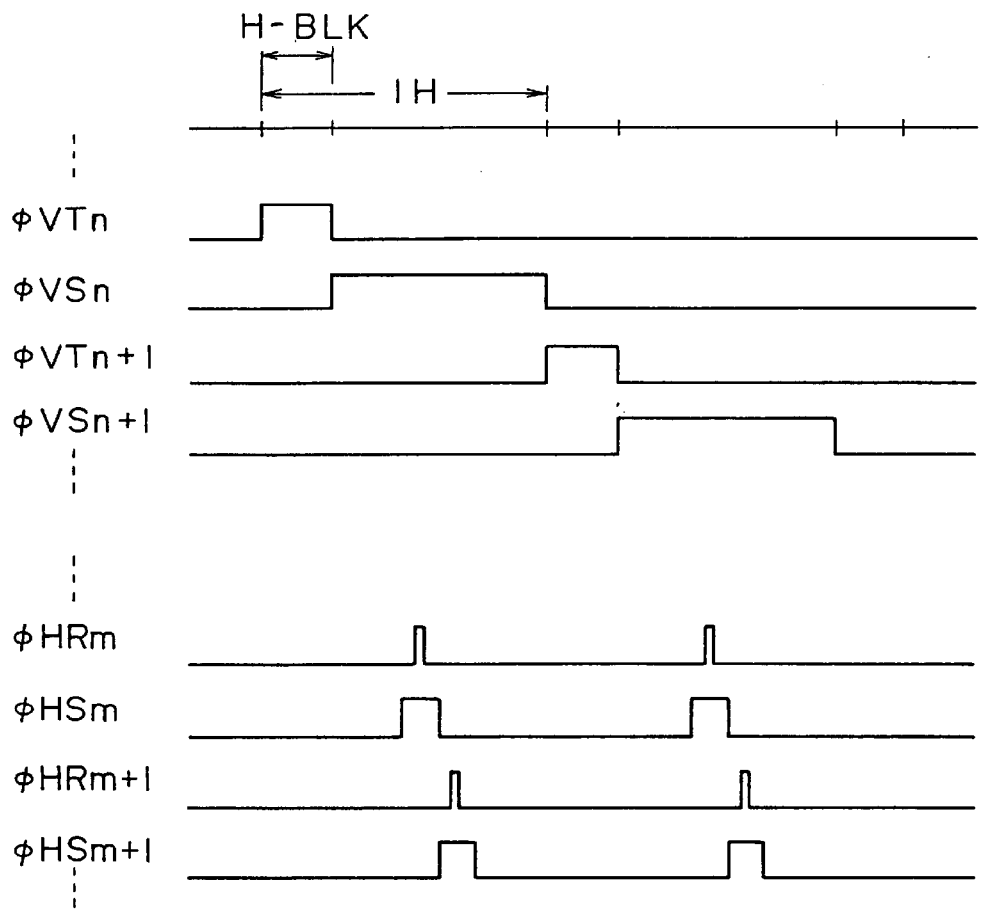
FIG. 2 is a timing chart of signals for explaining the operation of the first embodiment.

Now the operation of the amplifying type solid-state image sensor in the first embodiment of the above structure will be described below with reference to a timing chart of FIG. 2.

First, a vertical read scanning pulse $\phi VT_n$, ($\phi VT_1$, ..., $\phi VT_n$, $\phi VT_{n+1}$, ..., $\phi VT_N$) is outputted from the vertical scanning circuit 23, and then the FD read MOS transistors 12 are turned on sequentially per pixel row, so that the signal charge (electron) stored in the photodiode 11 through photoelectric conversion is transferred to the relevant FD (drain electrode of MOS transistor 12=main electrode on the reverse side with respect to photodiode 11). Such transfer of the signal charge from the photodiode 11 to the FD is performed during a horizontal blanking (H-BLK) interval.

Transfer of the signal charge to the FD causes a change in the potential of the FD. The signal voltage of the FD is converted into a signal current by the FD amp MOS transistor 13 whose gate electrode is connected to the FD. And subsequently during a horizontal video period, a vertical select scanning pulse $\phi VS_n$ ($\phi VS_1$, ..., $\phi VS_n$, $\phi VS_{n+1}$, ..., $\phi VS_N$) is outputted from the vertical scanning circuit 23, and then the vertical select MOS transistor 15 is turned on, so that the signal current appears on the vertical signal line 20.

During this horizontal video period, a horizontal select scanning pulse $\phi HS_m$, ($\phi HS_1$, ..., $\phi HS_m$, $\phi HS_{m+1}$, ..., φHS$_M$) is outputted from the horizontal scanning circuit 24, and then the horizontal select MOS transistor 22 is turned on, so that the signal current appearing on the vertical signal line 20 is caused to flow in the horizontal signal line 21 via the horizontal select MOS transistor 22, whereby the signal current is supplied via the horizontal signal line 21 to the CDS circuit 25.

Immediately thereafter, a horizontal reset pulse φHR$_m$ (φHR$_1$, . . . , φHR$_m$, φHR$_{m+1}$, . . . , φHR$_M$) is supplied from the horizontal scanning circuit 24 to the relevant pixel which has outputted the signal current, whereby the FD reset MOS transistor 14 is turned on to reset the FD. As obvious from the timing chart of FIG. 2, the horizontal reset pulse φHR$_m$ is generated substantially at the midpoint of generation of the horizontal select scanning pulse φHS$_m$.

Therefore, the signal charge of the FD after extinction of the horizontal reset pulse φHR$_m$, i.e., the post-reset signal charge, is converted into a signal current by the FD amp MOS transistor 13, and this signal current flows in the horizontal line 21 from the vertical select MOS transistor 15 via the vertical signal line 20 and the horizontal select MOS transistor 22. Then the signal current is supplied to the CDS circuit 25 via the horizontal signal line 21.

In this manner, such a series of operations of signal output→FD reset→signal output relative to one pixel 16 are performed per pixel row sequentially in response to a horizontal reset pulse φHR$_m$, and a horizontal select scanning pulse φHS$_m$ outputted from the horizontal scanning circuit 24. Further, the same operations for the next pixel row to be selected are performed in response to a vertical read scanning pulse φVT$_n$ and a vertical select scanning pulse φVS$_n$ outputted from the vertical scanning circuit 23, whereby a signal current of one picture is outputted per pixel.

Regarding now one pixel positioned on the nth row and the mth column, when the mth-column pixel is selected with a rise of the horizontal select scanning pulse φHS$_m$, the FD pre-reset and post-reset signal currents of the pixel are outputted to the horizontal signal line 21. More specifically, the signal current of the pixel in one state where the signal charge is stored, and the signal current of the pixel in another state where the signal charge is reset, are outputted and supplied successively to the CDS circuit 25. And correlated double sampling is executed in this CDS circuit 25 on the basis of such pre-reset and post-reset pixel signals, hence eliminating the characteristic deviation principally in the FD amp MOS transistor 13.

Figure 3:
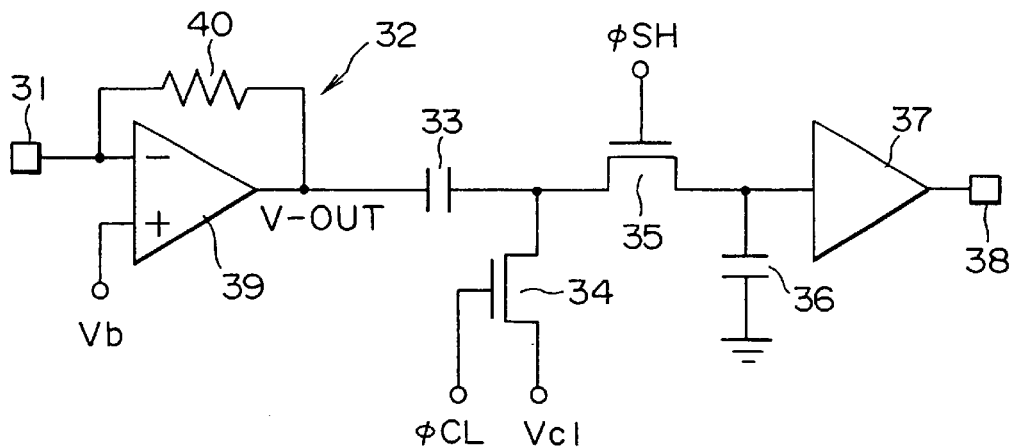
FIG. 3 is a circuit diagram showing an exemplary configuration of a CDS circuit.

FIG. 3 shows an exemplary concrete configuration of the CDS circuit 25. This circuit 25 comprises a current-voltage converter 32 whose input end is connected to an input terminal 31, a clamp capacitor 33 whose one end is connected to an output end of the current-voltage converter 32, a clamp MOS transistor 34 whose one main electrode is connected to the other end of the clamp capacitor 33, a sample hold MOS transistor 35 whose one main electrode is connected to the other end of the clamp capacitor 33, a sample hold capacitor 36 connected between the other main electrode of the sample hold MOS transistor 35 and the ground, and a buffer amplifier 37 connected between the other main electrode of the sample hold MOS transistor 35 and an output terminal 38.

In this CDS circuit 25, the current-voltage converter 32 consists of a differential amplifier 39 which receives, at its inverting (−) input, a signal current supplied via the input terminal 31, and also receives a predetermined bias voltage Vb at its non-inverting (+) input; and a feedback resistor 40 connected between the inverting input end of the differential amplifier 39 and the output end thereof. This converter 32 serves to convert the signal current into a signal voltage. A clamp voltage Vcl is applied to the other main electrode of the clamp MOS transistor 34, and a clamp pulse φCL to the gate electrode thereof, respectively. Further, a sample hold pulse φSH is applied to the gate electrode of the sample hold MOS transistor 35.

Figure 4:
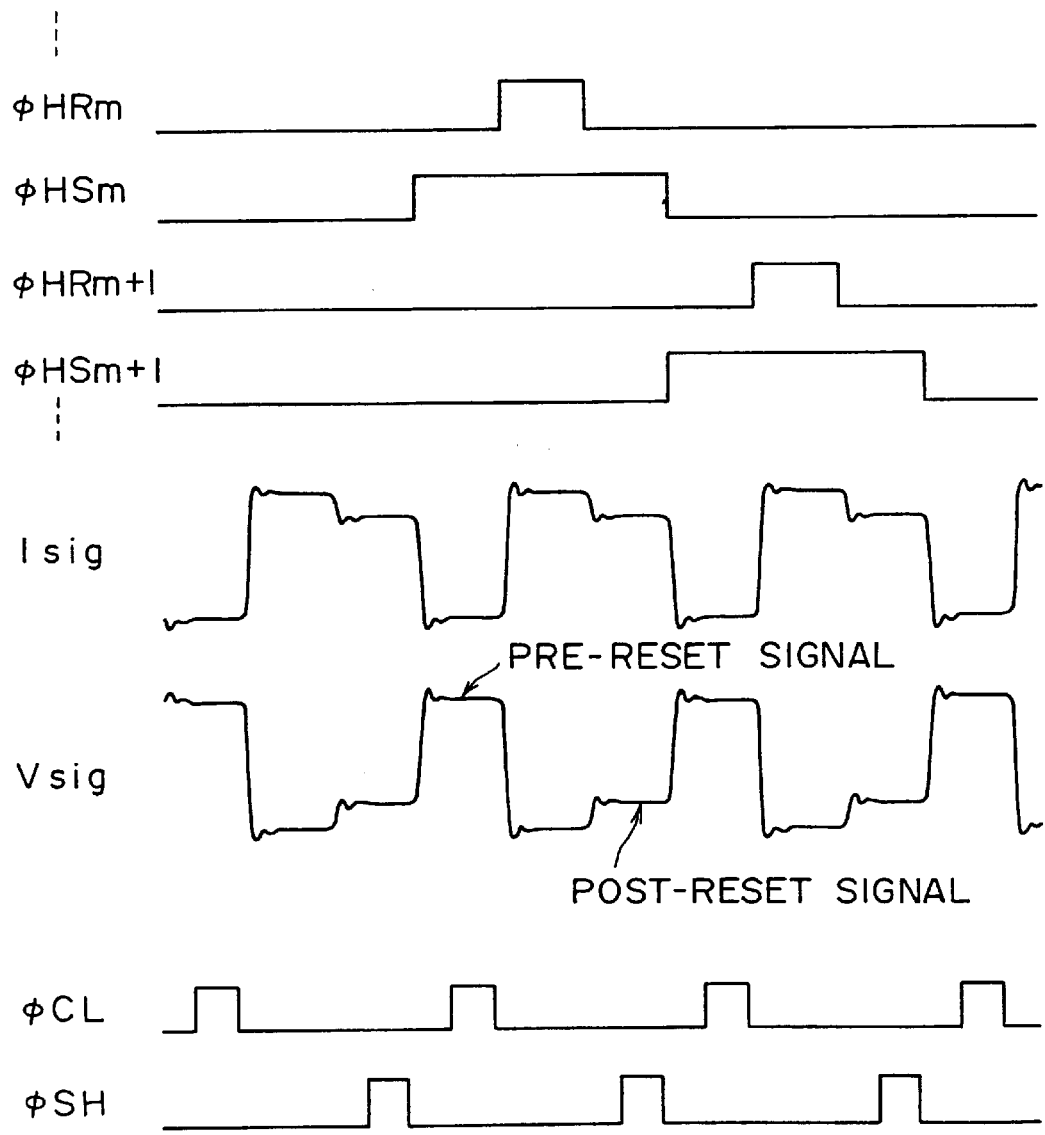
FIG. 4 is a timing chart of signals for explaining the operation the CDS circuit in the first embodiment.

Next, the operation performed in the CDS circuit 25 of the above configuration will be described below with reference to a timing chart of FIG. 4.

In response to rise of a horizontal select scanning pulse φHS$_m$, a pixel pre-reset signal current Isig is supplied to the input terminal 31 and then is converted into a signal voltage Vsig of reverse polarity by the current-voltage converter 32. Meanwhile a clamp pulse φCL rises in synchronism with the period during which the pixel pre-reset signal voltage Vsig is outputted. Then the clamp MOS transistor 34 is turned on to clamp the clamp capacitor 33 at a clamp voltage Vcl.

Subsequently the pixel is reset in response to rise of a horizontal reset pulse φHR$_m$. Then a sample hold pulse φSH rises in synchronism with the pixel post-reset signal voltage Vsig, whereby the sample hold MOS transistor 35 is turned on to activate the sample hold capacitor 36, so that correlated double sampling is executed. Thus, due to such correlated double sampling based on the pre-reset and post-reset pixel signals, it becomes possible to eliminate the characteristic deviation principally in the FD amp MOS transistor 13.

As described above, the FD of each pixel 16 is reset every time one pixel signal is outputted, and correlated double sampling is executed on the basis of the pre-reset and post-reset pixel signals, hence suppressing the fixed pattern noise derived from the characteristic deviation in the pixel and also the fixed pattern noise of vertical streaks derived from the characteristic deviation in the switch element (horizontal select MOS transistor 22) connected to the vertical signal line 20.

The fixed pattern noise derived from the characteristic deviation in the pixel is generated as an offset component from the FD amp MOS transistor 13 of the pixel 16, and fundamentally this noise can be eliminated by executing correlated double sampling of the pixel pre-reset and post-reset signals. As for the other fixed pattern noise of vertical streaks derived from the characteristic deviation in the switch element connected to the vertical signal line 20, the circuit configuration is so contrived as to supply the pixel pre-reset and post-reset signals via the same signal path, not via separate switch elements (e.g., horizontal select MOS transistors), thereby preventing generation of such noise in principle.

Figure 5:
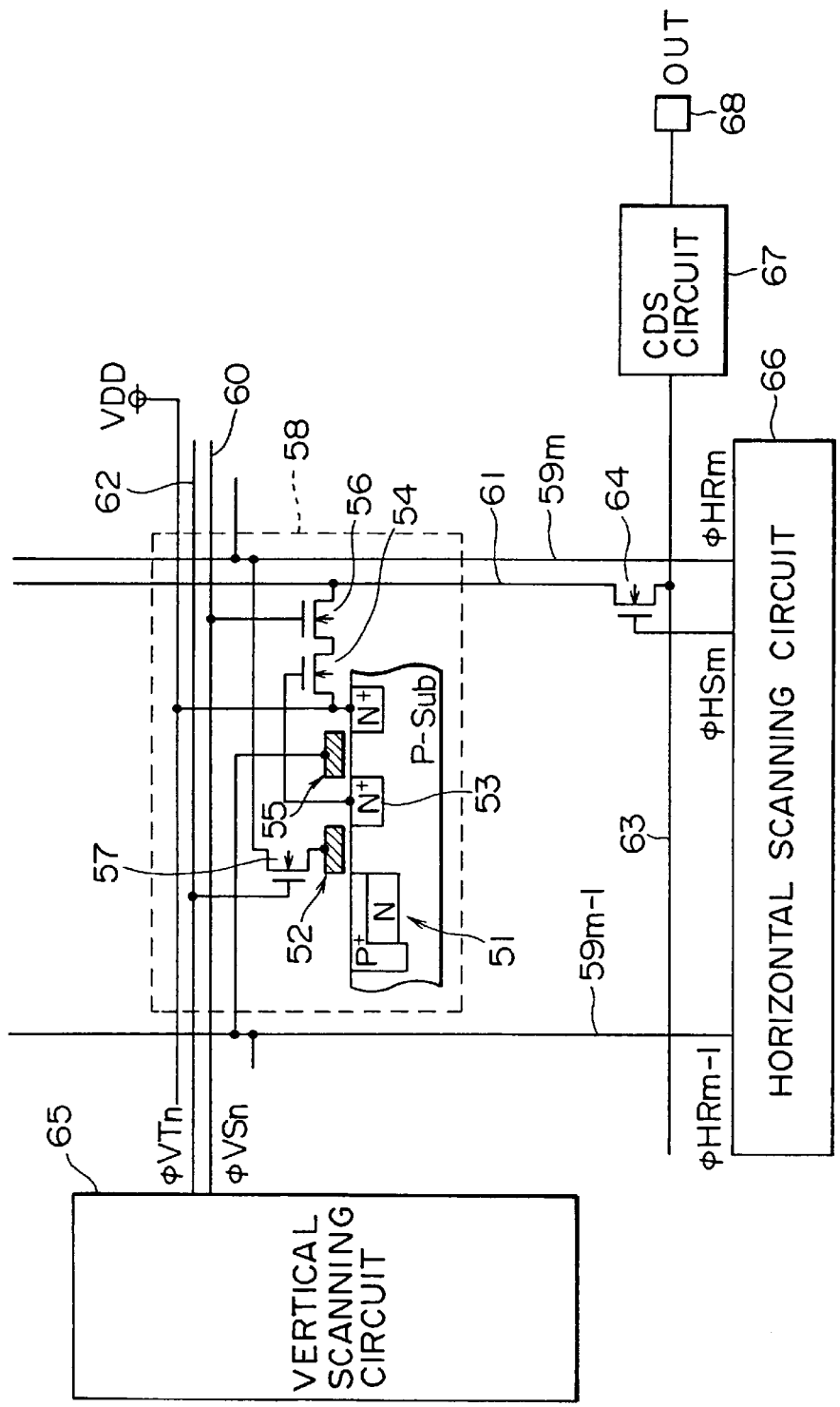
FIG. 5 is a block diagram showing the structure of a second embodiment.

FIG. 5 is a block diagram showing the structure of a second embodiment of the present invention. In this diagram, a unit pixel 58 is composed of a photodiode 51 as a photoelectric conversion element, a read gate 52, an FD 53 consisting of an N+ layer, an FD amp MOS transistor 54, an FD reset gate 55, a vertical select MOS transistor 56, and a read control MOS transistor 57. Entire unit pixels are arrayed two dimensionally to form a matrix of rows and columns. In order to simplify the diagram, merely one unit pixel 58 (nth row, mth column) is shown here.

In this unit pixel 58, the photodiode 51 is a buried type where its upper side adjacent to the surface of a substrate is covered with a P+ layer. The read gate 52 is positioned above a channel between the photodiode 51 and the FD 53, and serves to read out the signal charge obtained from the photodiode 51 through photoelectric conversion, and then supplies the signal charge to the FD 53. Subsequently the FD 53 converts the signal charge, which has been read out from the photodiode 51, into a signal voltage. The FD amp MOS transistor 54 converts the signal voltage of the FD 53 into a signal current and then outputs the same.

The gate electrode of the FD reset gate 55 is connected to a horizontal read line $59_{m-1}$ on the preceding column, the gate electrode of the vertical select MOS transistor 56 to a vertical select line 60, and the source electrode thereof to a vertical signal line 61, respectively. The gate electrode of the read control MOS transistor 57 is connected to a vertical read line 62, and the drain electrode thereof to a horizontal read line $59_m$, respectively. Further the horizontal select MOS transistor 64 is connected between one end of a vertical signal line 61 and a horizontal signal line 63.

A row-select vertical scanning circuit 65 and a column-select horizontal scanning circuit 66 are provided. A vertical read scanning pulse $\phi VT_n$ outputted from the vertical scanning circuit 65 is applied to the vertical read line 62, and a vertical select scanning pulse $\phi VS_n$ to the vertical select line 60, respectively. A horizontal read scanning pulse $\phi HR_m$ outputted from the horizontal scanning circuit 66 is applied to the horizontal read line 59m, and a horizontal select scanning pulse $\phi HS_m$ to the gate electrode of the horizontal select MOS transistor 64, respectively.

The horizontal scanning circuit 66 serves also as a reset circuit, and a horizontal read scanning pulse $\phi HR_m$ outputted from this horizontal scanning circuit 66 is fed to the horizontal read line $59_m$ while being fed as a reset pulse to a horizontal read line $59_{m+1}$ on the next column. At this time, the horizontal read line $59_{m+1}$ functions as a horizontal reset line.

Now the wiring structure contrived in the present invention will be explained below. In one example, there is composed a three-layer wiring structure wherein the vertical signal line 61 and the horizontal read line 59 extending vertically in FIG. 5 are formed in a first wiring layer; the vertical select line 60 and the vertical read line 62 extending horizontally in the diagram are formed in a second wiring layer; and the power supply line serving also as a light shield layer between one pixel 58 and the adjacent pixels is formed in a third wiring layer. In another example, there is composed a three-layer wiring structure wherein the vertical select line 60 and the vertical read line 62 extending horizontally in FIG. 5 are formed in a first wiring layer; the vertical signal line 61 and the horizontal read line 59 extending vertically in the diagram are formed in a second wiring layer; and the power supply line serving also as a light shield layer between one pixel 58 and the adjacent pixels is formed in a third wiring layer.

A CDS circuit 67 of a simple configuration is provided at the output end of the horizontal signal line 63 to serve as a differential circuit which takes the difference between pixel pre-reset and post-reset signals. The configuration of this CDS circuit 67 is such as that used in the foregoing embodiment as shown in FIG. 3. The output end of the CDS circuit 67 is connected to an output terminal 68 of the image sensor.

Figure 6:
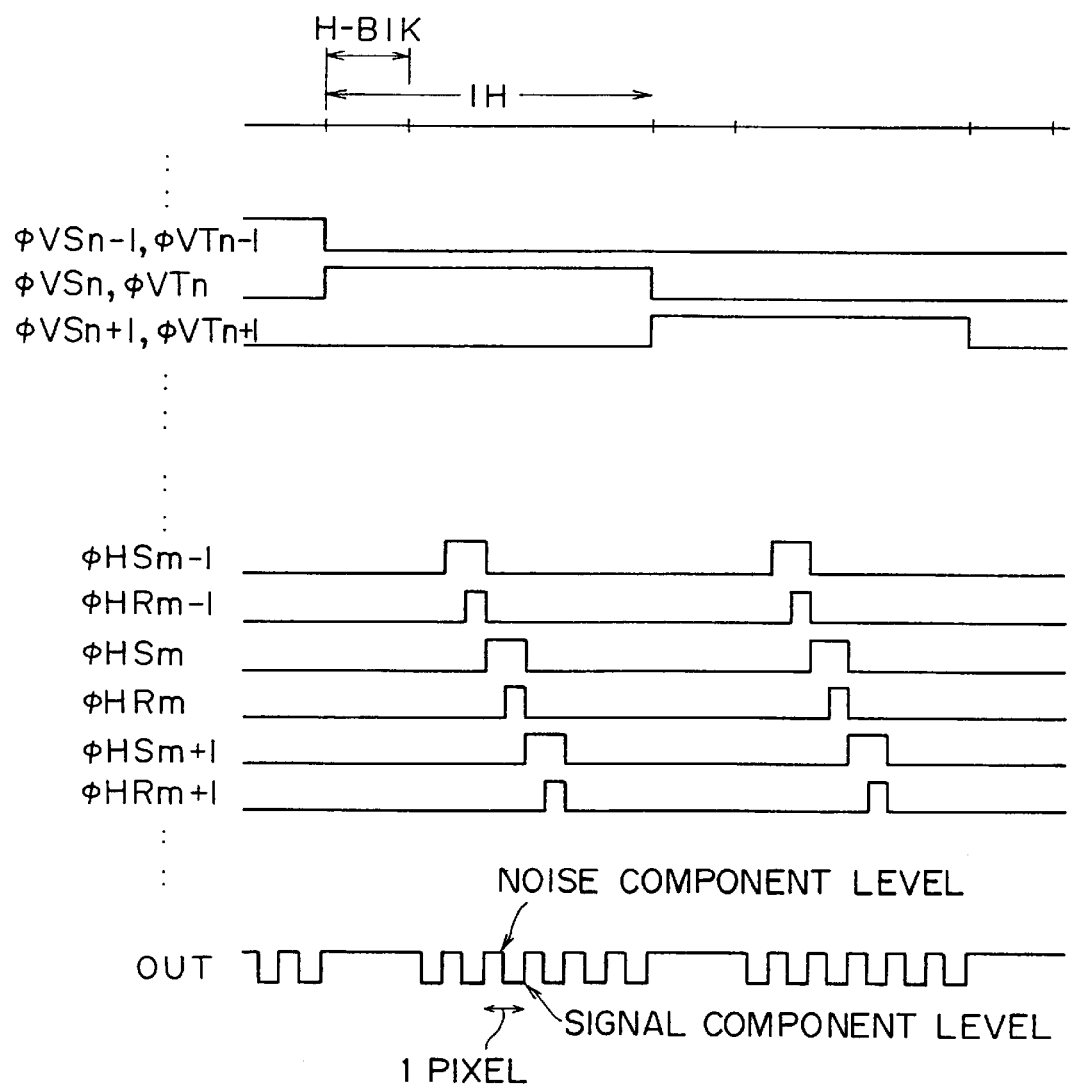
FIG. 6 is a timing chart of signals for explaining the operation of the second embodiment.

Next, the operation of the amplifying type solid-state image sensor in the second embodiment of the above structure will be described below with reference to a timing chart of FIG. 6.

The incident light received for a certain fixed period is converted into an electric signal by the buried photodiode 51 and then is stored as a signal charge therein. Before the signal charge is read out from the photodiode 51 to the FD 53 (during output of the preceding pixel signal), a horizontal read scanning pulse $\phi HR_{m-1}$ of the preceding column is outputted from the horizontal scanning circuit 66 and then is applied to the gate electrode of the FD reset gate 55 via the horizontal read line $59_{m-1}$, whereby the FD 53 is reset previously to a VDD level.

Immediately thereafter, a horizontal select scanning pulse $\phi HS_m$ of the mth column is outputted from the horizontal scanning circuit 66, hence inducing a period to output the signal from the pixel on the nth row and mth column. During this period, the vertical select scanning pulse $\phi VS_n$ is at a "high" level and the vertical select MOS transistor 56 is in its on-state, so that during the first half of this signal output period, the signal of the reset FD 53 is outputted to the vertical signal line 61 via the FD amp MOS transistor 54 and the vertical select MOS transistor 56.

And during the second half of this signal output period, a horizontal read scanning pulse $\phi HR_m$ is outputted from the horizontal scanning circuit 66 and then is applied to the drain electrode of the read control MOS transistor 57 via the horizontal read line $59_m$. Since a vertical read scanning pulse $\phi VT_n$ is being applied to the gate electrode of the read control MOS transistor 57, this transistor 57 is turned on, so that the signal charge is read out from the photodiode 51 to the FD 53 and is further outputted to the vertical signal line 61 via the FD amp MOS transistor 54 and the vertical select MOS transistor 56.

As a result, during the period to output the signal from the pixel on the nth row and mth column, the FD 53 is placed in two potential states, i.e., before and after the pixel signal charge is read out. And the signal currents obtained by amplifying such two potentials in the FD amp MOS transistor 54 are supplied successively from the vertical signal line 61 to the CDS circuit 67 via the horizontal select MOS transistor 64 and the horizontal signal line 63, as a noise component and a signal component which correspond respectively to the two potential states before and after the pixel signal charge is read out.

More specifically, in the nth horizontal scanning period (1H), the vertical read scanning pulse $\phi VT_n$ and the vertical select scanning pulse $\phi VS_n$ outputted from the vertical scanning circuit 65 rise to select the nth pixel row. And during the horizontal video period in such 1H except the horizontal blanking interval, the horizontal select scanning pulse $\phi HS_m$ and the horizontal read scanning pulse $\phi HR_m$ outputted from the horizontal scanning circuit 66 rise for horizontally scanning the nth pixel row, whereby the signal currents are outputted sequentially.

The signal of one pixel is kept, in the first half of the output period, at its noise component level immediately after reset of the FD, and is kept, in the second half thereof, at its signal component level obtained by reading out the pixel signal charge to the FD 53. In order to realize such operation, the horizontal select scanning pulse $\phi HS_m$ and the horizontal read scanning pulse $\phi HR_m$ are outputted with a timing difference. More specifically, the timing relationship therebetween is such that the horizontal select scanning pulse $\phi HS_m$ is kept at a high level in the entire period of one pixel, while the horizontal read scanning pulse $\phi HR_m$ is kept at a "high" level only in the second half period of one pixel, i.e., only in the output period of the signal component.

Consequently, as described above, the FD 53 of one pixel, whose signal is to be outputted, is reset previously in the period during which the signal component is outputted from the preceding pixel (i.e., in the period during which the horizontal read scanning pulse $\phi HR_{m-1}$ is kept at a "high" level), and subsequently in the pixel signal output period, first the noise component represented by the post-reset signal of the FD 53 is outputted.

And in the second half of the signal output period, the horizontal read scanning pulse $\phi HR_m$ is supplied to the gate electrode of the read gate 52 through the read control MOS transistor 57 which is placed in its on-state by the vertical read scanning pulse $\phi VR_n$ applied to its gate electrode, whereby the signal charge is read out from the buried photodiode 51 and then is supplied to the FD 53. And the potential of the FD 53 varied by reading out the signal charge is converted by the FD amp MOS transistor 54 into a signal current, which is then outputted as a pixel signal, i.e., a signal component.

The signal current thus outputted is processed through the CDS circuit 67 having the configuration of FIG. 3 for example, so that a satisfactory video signal can be obtained with suppression of the characteristic deviation in the FD amp MOS transistor 54 of each pixel, particularly the fixed pattern noise derived from the deviation of the threshold voltage Vth.

Figure 7:
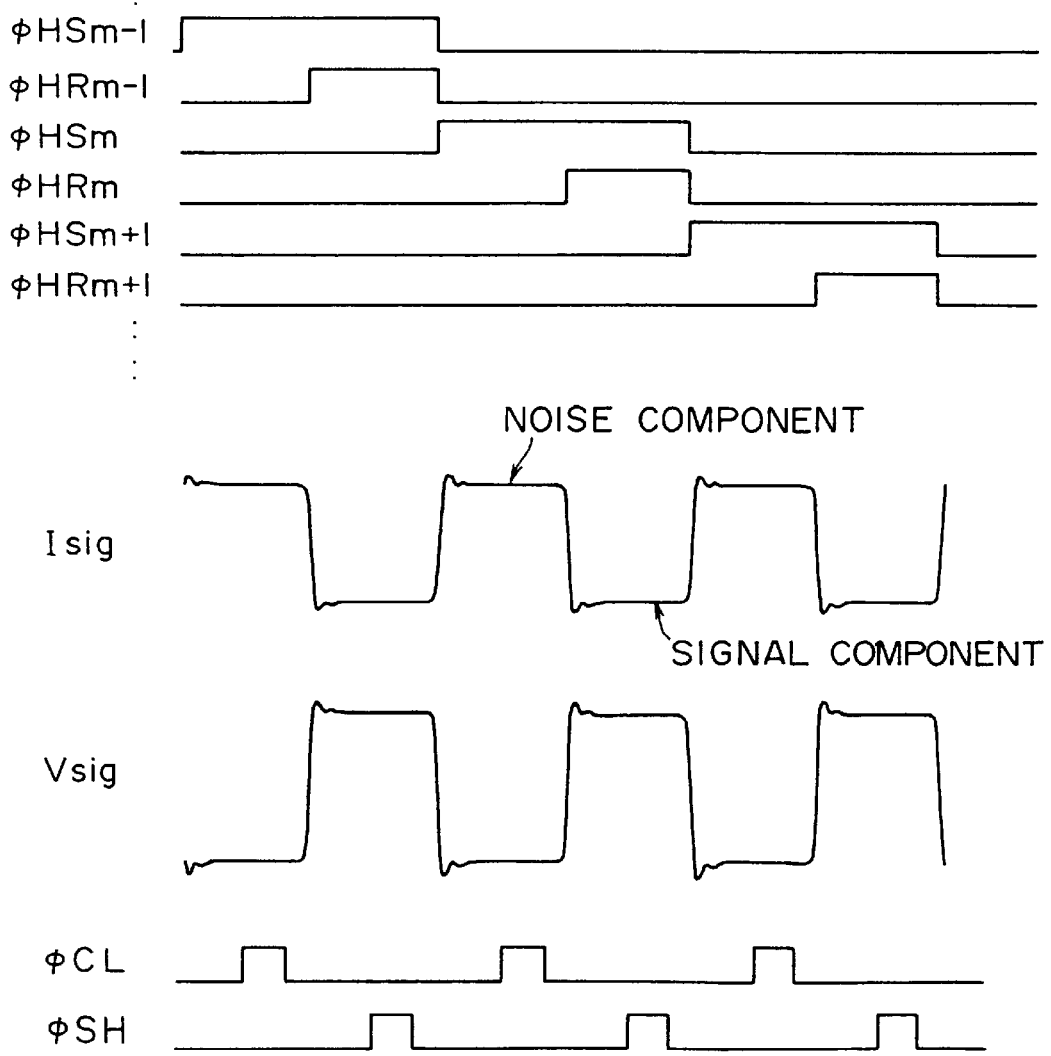
FIG. 7 is a timing chart of signals for explaining the operation of the CDS circuit in the second embodiment.

Now the operation performed in the CDS circuit 67 of the configuration shown in FIG. 3 will be described below with reference to a timing chart of FIG. 7.

The signal current Isig corresponding to the noise component is fed to the input terminal 31 in the first half period during which the horizontal select scanning pulse $\phi HS_m$ is at its "high" level, and then is converted by the current-voltage converter 32 into a signal voltage Vsig of reverse polarity. A clamp pulse $\phi CL$ rises in synchronism with the output period of the signal voltage Vsig representing the noise component. Subsequently the clamp MOS transistor 34 is turned on, so that the potential at the junction of the clamp capacitor 33 and the sample hold MOS transistor 35 is initialized to a clamp voltage Vcl.

Thereafter, when the signal current Isig representing the signal component is fed to the input terminal 31 in the second half period during which the horizontal select scanning pulse $\phi HS_m$ is at its "high" level, i.e., the horizontal read scanning pulse $\phi HR_m$ is at its "high" level, then a proportional signal voltage Vsig is applied from the current-voltage converter 32 to the input end of the clamp capacitor 33. Consequently, the potential at the output end of the clamp capacitor 33 is changed in accordance with the clamp voltage Vcl by a value corresponding to the difference between the noise component and the signal component.

Subsequently the sample hold pulse $\phi SH$ rises, and then the sample hold MOS transistor 35 is turned on in response thereto, so that the voltage changed in accordance with the clamp voltage Vcl is held in the sample hold capacitor 36, hence eliminating the characteristic deviation of the FD amp MOS transistor 54 in the pixel 58, principally the deviation of the threshold voltage Vth.

In the second embodiment, as described, the fixed pattern noise derived from a dark current can be effectively suppressed due to the use of a buried photodiode as the photodiode 51. More specifically, electrons that cause dominant generation of a dark current are generated by thermal excitation from the semiconductor surface level, but free charges existing in the surface P+ layer of the photodiode 51 are only positive holes and the electrons are in a state of depletion, so that the surface level is filled with positive holes, and generation of electrons from the surface level is extremely diminished. Consequently, it becomes possible to widely reduce the shot noise resulting from any dark current variation or the dark current itself.

As described above, the signal charge is read out from the photodiode 51 to the FD 53 in the pixel signal duration, and the signals obtained before and after reading the signal charge (i.e., noise component and signal component) are outputted sequentially, and then correlated double sampling is executed on the basis of the output signals, hence suppressing the fixed pattern noise derived from the deviation of the threshold voltage Vth of the FD amp MOS transistor 54 in each pixel. Further, the circuit configuration is so contrived that the signals before and after reading the signal charge are delivered via the same signal path and not via separate switch elements (horizontal select MOS transistors), thereby suppressing also the fixed pattern noise of vertical streaks derived from the characteristic deviation of the switch element connected to the vertical signal line 61.

Figure 8:
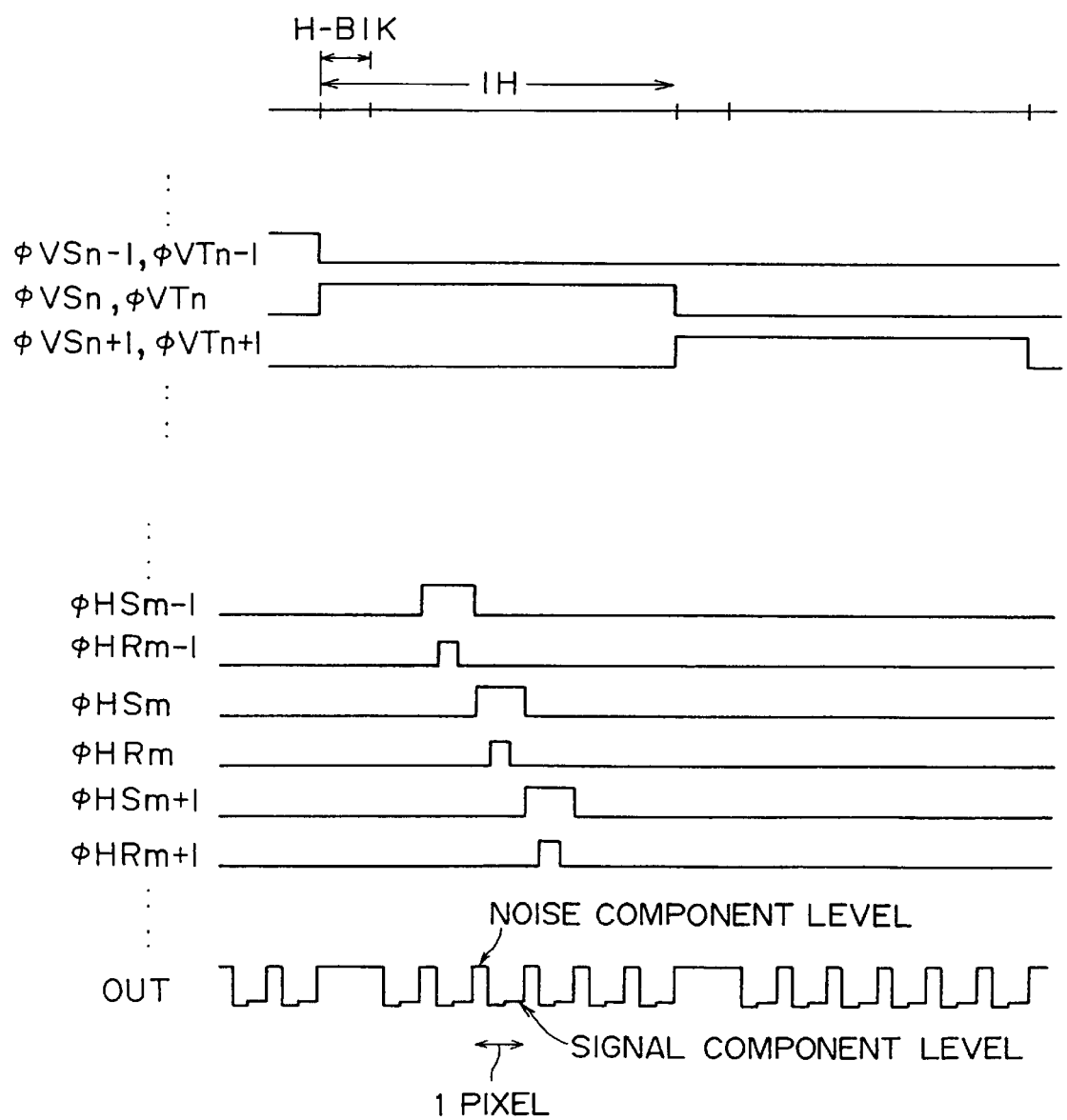
FIG. 8 is a timing chart of signals showing another example of driving timing in the second embodiment.
Figure 9:
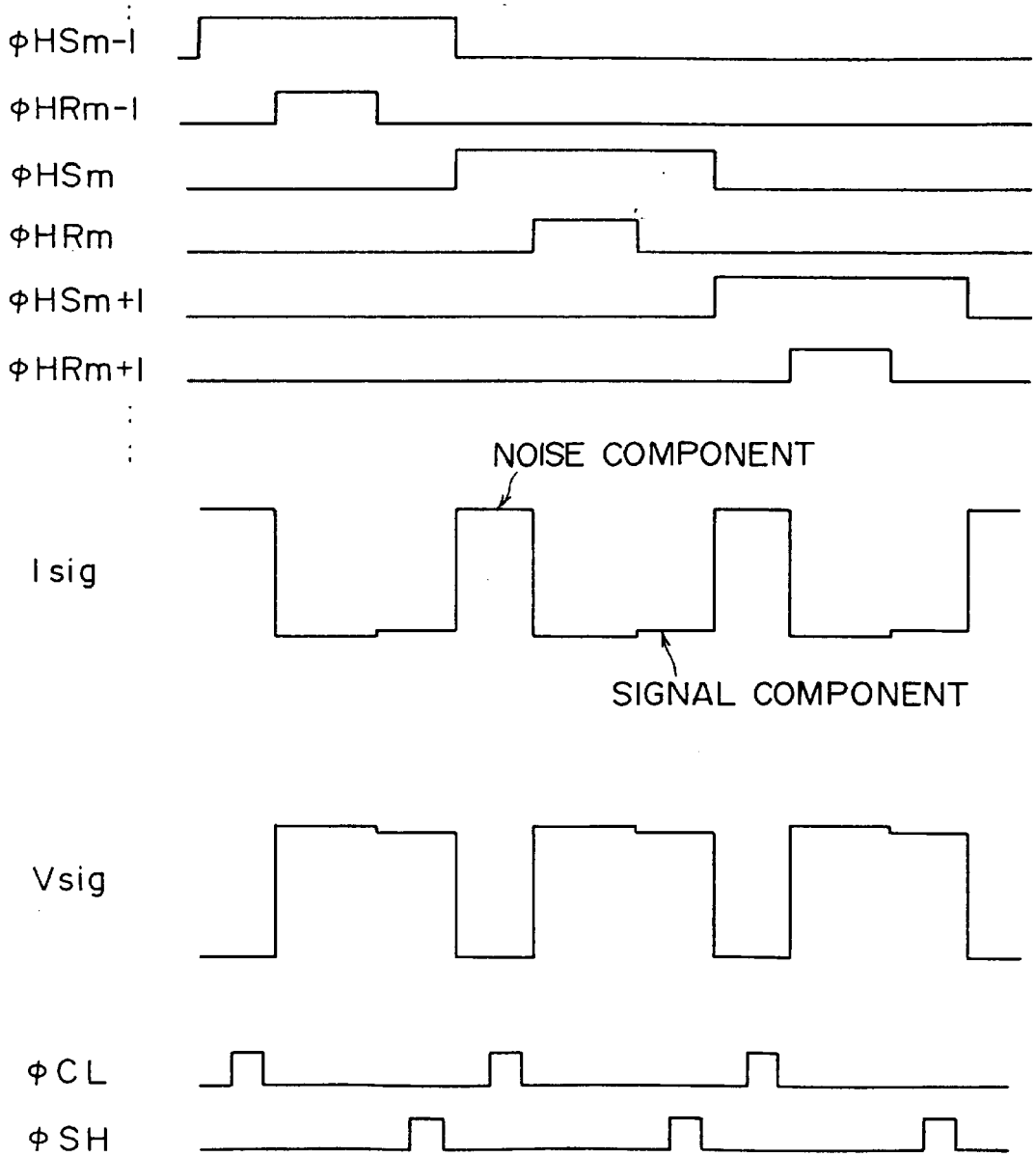
FIG. 9 is a timing chart of signals for explaining the operation of the CDS circuit relative to a further example of driving timing in the second embodiment.

Next, a description will be given on another example of driving timing in the second embodiment. FIG. 8 is a timing chart of signals showing another example and FIG. 9 is a timing chart of signals relative to the operation of the CDS circuit 67 in such example of driving timing. In this example, a feature resides in the point that the signal component is read out after the horizontal read scanning pulse $\phi HR_m$ is turned to its "low" level.

First, a horizontal read scanning pulse $\phi HR_{m-1}$ of the preceding column is outputted from the horizontal scanning circuit 66 and then is applied to the gate electrode of the FD reset gate 55 via the horizontal read line $59_{m-1}$, whereby the FD 53 is reset to a VDD level. And immediately thereafter, a horizontal select scanning pulse $\phi HS_m$ of the mth column is outputted from the horizontal scanning circuit 66, hence inducing a period to output the signal from the pixel on the nth row and mth column. In this period, the noise component amplified by the FD amp MOS transistor 54 in accordance with the level of the reset FD 53 is outputted to the vertical line 61 via the vertical select MOS transistor 56 and further to the horizontal signal line 63 via the horizontal select MOS transistor 64.

And during this signal output period, a horizontal read scanning pulse $\phi HR_m$ is outputted from the horizontal scanning circuit 66 and then is applied to the drain electrode of the read control MOS transistor 57 via the horizontal read line $59_m$. Since the horizontal read scanning pulse $\phi HR_m$ is applied via the read control MOS transistor 57 placed in its on-state by the pulse $\phi VT_n$, the read gate 52 is also turned on, so that the signal charge stored in the photodiode 51 is read out therefrom to the FD 53 by the read gate 52.

Subsequently the horizontal read scanning pulse $\phi HR_m$ is extinguished (turned to its "low" level) and, after the FD read gate 52 is turned off via the read control MOS transistor 57, the signal component amplified by the FD amp MOS transistor 54 in accordance with the signal charge read and supplied to the FD 53 is outputted to the vertical signal line 61 via the vertical select MOS transistor 56 and further to the horizontal signal line 63 via the horizontal select MOS transistor 64.

Thus, the noise component and the signal component corresponding to the two potential states before and after reading out the signal charge of the pixel are outputted to the horizontal signal line 63, and are further supplied successively to the CDS circuit 67, where correlated double sampling is executed on the basis of such components to thereby suppress the fixed pattern noise derived from the characteristic deviation of the FD amp MOS transistor 54 in each pixel, especially from the deviation of the threshold voltage Vth.

Particularly in this example, the driving timing is so controlled as to read out the signal component after transition of the horizontal read scanning pulse $\phi HR_m$ to its low level, in such a manner that both of the potentials applied to the FD read gate 52 when reading out the noise component and the signal component have a low level, i.e., the same potential. Therefore the fixed pattern noise, which is derived from the MOS transistor constituting the FD read gate 52, can also be suppressed with certainty.

Figure 10:
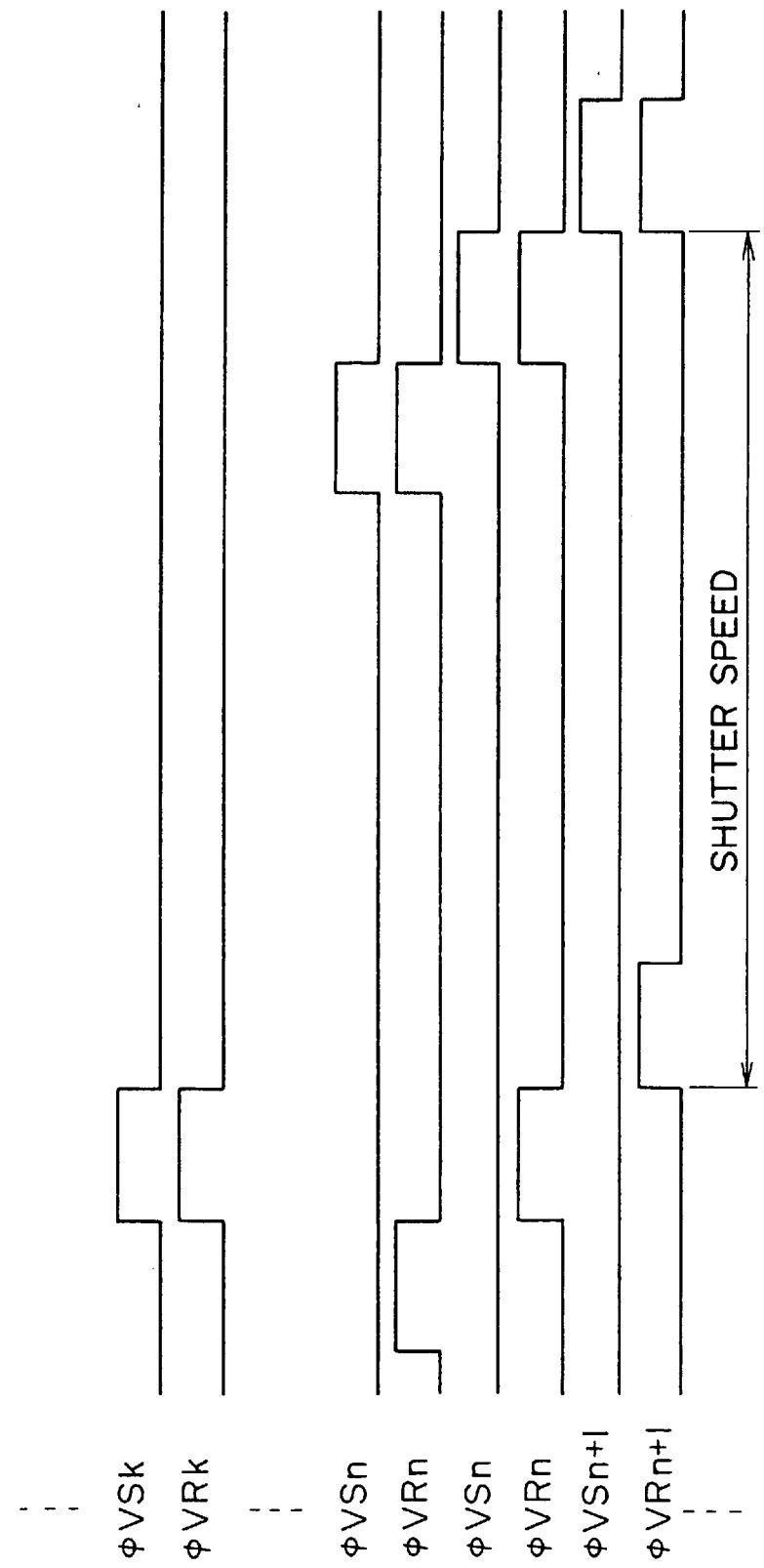
FIG. 10 is a timing chart of vertical scanning pulses in the operation of an electronic shutter.

Further in the solid-state image sensor of the present invention, the timing relative to the vertical select scanning pulse $\phi VS_n$ and the vertical read scanning pulse $\phi VT_n$ is so contrived as to realize an electronic shutter operation also. FIG. 10 is a timing chart of the vertical select scanning pulse $\phi VS_n$ and the vertical read scanning pulse $\phi VT_n$ in performing an electronic shutter operation.

In an electronic shutter operation, the timing of the vertical read scanning pulse $\phi VT_n$ is different from that in an ordinary operation. More specifically, before the timing to read out the nth pixel row, only the vertical read scanning pulse $\phi VT_n$ alone is caused to rise previously by a time corresponding to a shutter speed, while the vertical select scanning pulse $\phi VS_n$ is kept unchanged, and the signal charge is read out from the photodiode 51 to the FD 53 in this state.

Supposing that a pixel signal of the kth row is being outputted, the signal current amplified by the FD amp MOS transistor 54 of the nth-row pixel is not outputted since the vertical select scanning pulse $\phi VS_n$ is not caused to rise, so that the nth-row pixel signal is not outputted together with the kth-row pixel signal. As a result, the signal charge stored in the photodiode 51 is read out (reset) at this time point, and then storage of the signal charge is started again. And when the nth pixel row is to be read, the signal current representing the signal charge stored correspondingly to the shutter speed is outputted.

Any unrequited signal charge read out previously to the FD 53 for resetting the photodiode 51 to perform the electronic shutter operation is absorbed into the reset drain (N+ layer) connected to a power source VDD, as the FD 53 is reset per horizontal scanning by the horizontal read scanning pulse $\phi HR_m$.

FIGS. 11A to 11D illustrate how the read gate 52 executes an overflow (anti-blooming) operation to prevent a phenomenon of blooming that the signal charges (electrons) obtained through photoelectric conversion of excess incident light on the photodiode 51 leak and mix into adjacent pixels and so forth. The diagrams of FIGS. 11A to 11D show four states of the potential from the photodiode 51 to the FD reset gate 55, representing a storage state, a read state, an FD reset state and an overflow state, respectively.

Figure 11A:
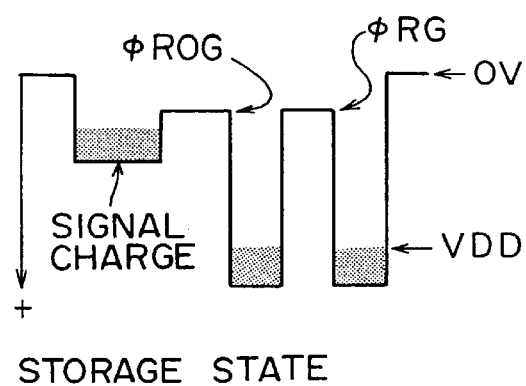
FIG. 11 is a potential diagram for explaining an anti-blooming operation.
Figure 11B:
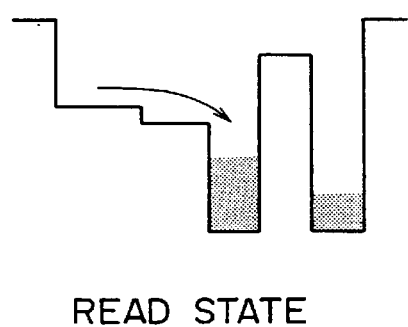
Figure 11C:
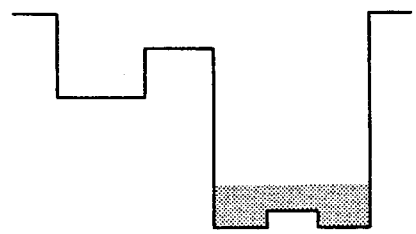
Figure 11D:
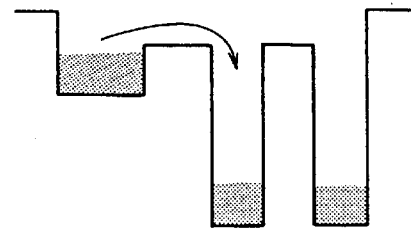

The potential $\phi ROG$ of the FD read gate 52 in the storage state of FIG. 11A is set to be higher than 0 V (potential in the element isolation area of the photodiode 51), so that the signal charge generated excessively by any intense incident light overflows into the FD 53 via the FD read gate 52. At this time, the overflow signal charge is reset by an FD reset operation performed per horizontal scanning and immediately before the pixel signal is read out to the FD 53, hence avoiding any harmful influence that may otherwise be given to the video signal.

In case any extremely intense light is incident to cause an overflow even in the FD 53 as well due to the overflow operation, the potential $\phi RG$ of the FD reset gate 55 in the storage state of FIG. 11A may be set higher than the potential $\phi ROG$ of the FD read gate 52 in the storage state of FIG. 11A, so that the signal charge having overflowed the FD 53 is absorbed into the reset drain via the FD reset gate 55 without reverse flow to the photodiode 51, hence preventing any harmful influence to the video signal.

In this manner, vertical scanning pulses are grouped into vertical select scanning pulses $\phi VS_n$ and vertical read scanning pulses $\phi VT_n$, and the timing relationship therebetween is set properly to realize a desired electronic shutter operation. And the structure is so devised as to equip the FD read gate 52 with a pixel signal overflow function in addition to its read function, thereby achieving a reduction of the pixel size.

In each of the above embodiments, the explanation has been given on an exemplary case of applying the present invention to an amplifying type solid-state image sensor using an FD (floating diffusion) amplifier as an amplifying element which constitutes a unit pixel. However, the invention is not limited thereto alone and may be applied also to, for example, an amplifying type solid-state image sensor of another structure using an FG (floating gate) amplifier as an amplifying element.

Figure 12:
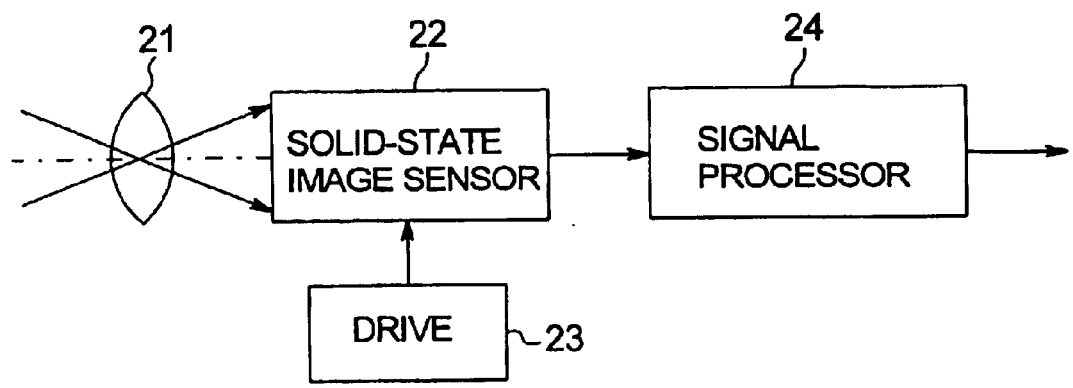
FIG. 12 is a schematic block diagram showing an exemplary structure of a camera according to the present invention.
Figure 13:
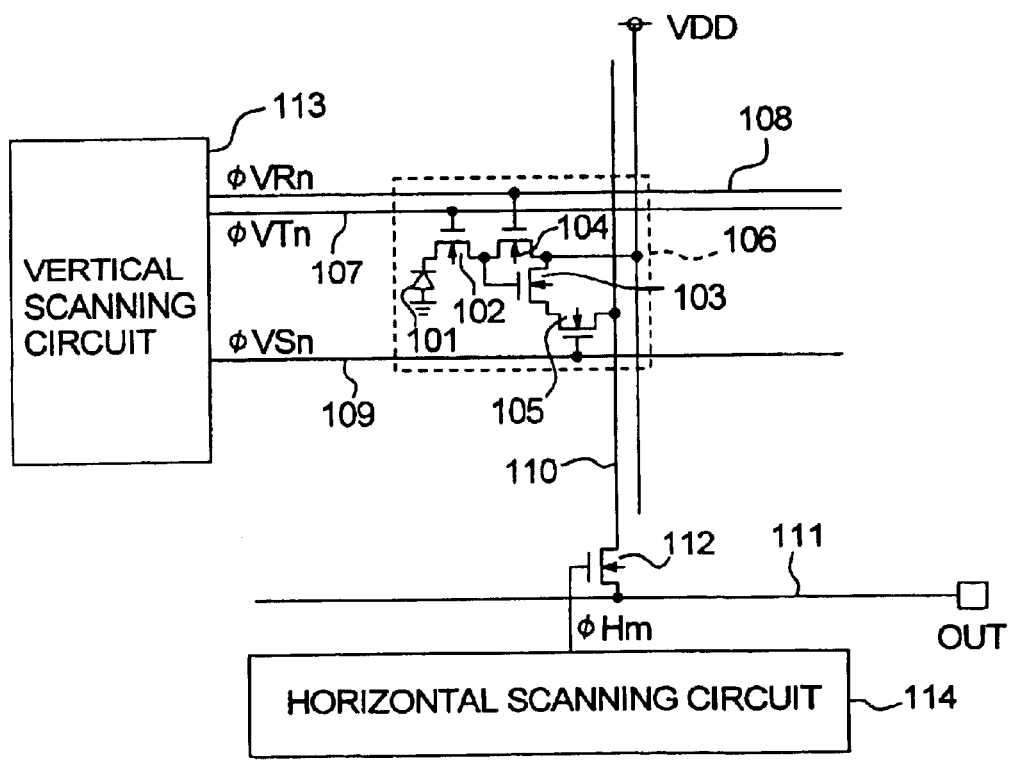
FIG. 13 is a block diagram showing an exemplary known structure of the related art.
Figure 14:
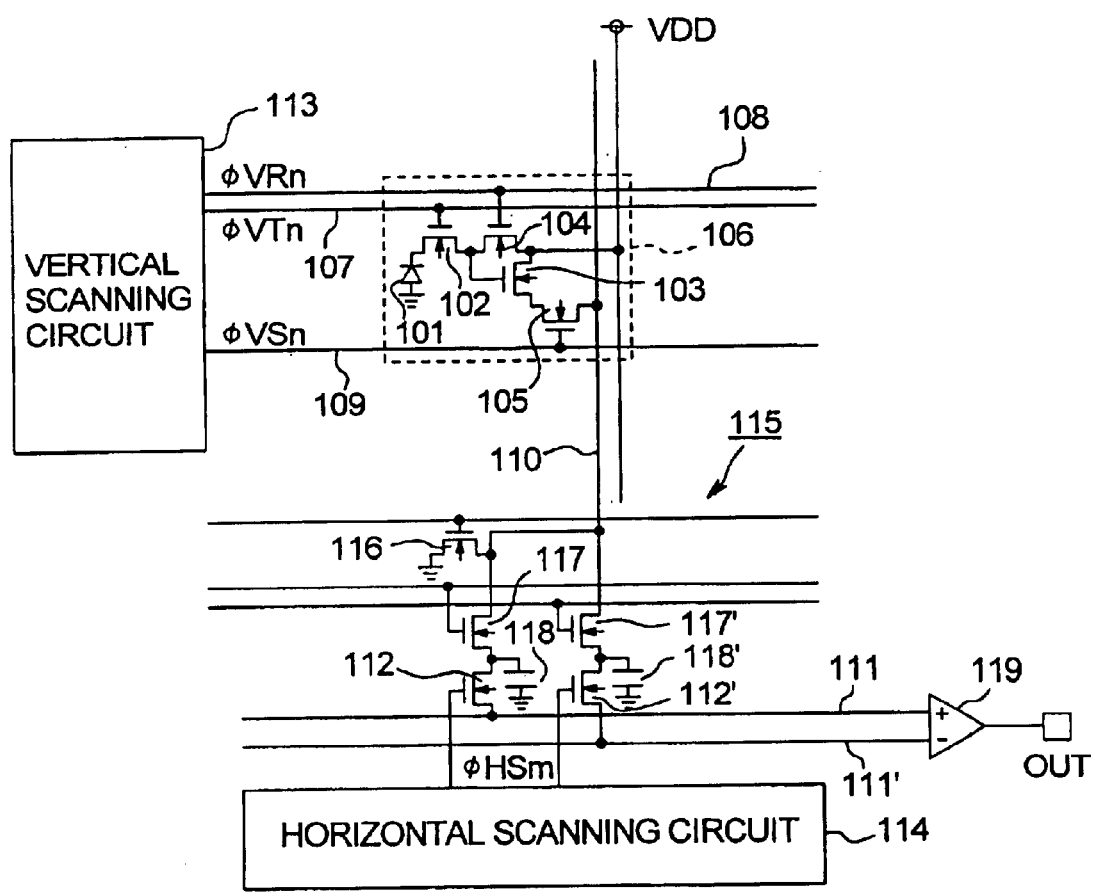
FIG. 14 is a block diagram showing another known structure to explain the problems in the related art.

FIG. 12 is a schematic block diagram showing an exemplary structure of a camera of the present invention which employs the aforementioned solid-state image sensor and the method of driving the same. In this diagram, incident light from an object scene is focused on an image forming plane of a solid-state image sensor 22 by an optical system including a lens 21. The solid-state image sensor 22 has the structure explained above. This image sensor 22 is driven on the basis of the aforementioned method by means of a drive 23 including a timing generator 7 in FIG. 1. The output signal of the solid-state image sensor 22 is processed in a signal processor 24 through various stages to become a video signal.

As described hereinabove, according to the solid-state image sensor of the present invention where unit pixels having an amplifying function are arrayed to form a matrix of rows and columns, a storage of each amplifying element is reset every time a pixel signal is outputted from each unit pixel, so that a pre-reset signal and a post-reset signal are outputted per pixel successively from each of the unit pixels, whereby fixed pattern noise can be suppressed by taking the difference between the pre-reset and post-reset signals. Further, the pre-reset and post-reset signals outputted from a vertical signal line to a horizontal signal line can be delivered via the same signal path, hence suppressing generation of the fixed pattern noise of vertical streaks.

Although the present invention has been described with reference to some preferred embodiments thereof, it is to be understood that the invention is not limited to such embodiments alone, and a variety of other changes and modifications will be apparent to those skilled in the art without departing from the spirit of the invention.

The scope of the invention, therefore, is to be determined solely by the appended claims.

What is claimed is:

1. A solid-state image sensor comprising:
    a plurality of pixels arranged in a matrix of rows and columns, each pixel having:
        a photoelectric conversion element,
        a floating diffusion,
        a transfer element for transferring a signal charge stored in said photoelectric conversion element to the floating diffusion,
        an amplifying element connected to the floating diffusion, a pixel select element connected to the amplifying element, the pixel select element for selecting output of said signal charge, and a reset element connected to said floating diffusion, the reset element for resetting said floating diffusion;

a vertical scanning circuit;

a horizontal scanning circuit;

a vertical signal line connected to an output of said pixel select element;

a horizontal signal line connected to said vertical signal line via a horizontal select switch, the horizontal signal line for outputting a signal; and a noise canceling circuit connected to one end of the horizontal signal line, wherein the horizontal scanning circuit provides a reset pulse to the reset element and a horizontal select pulse to the horizontal select switch each during a horizontal period, the reset pulse beginning after a start of the horizontal select pulse and ending before an end of the horizontal select pulse, effecting transfer of a pre-reset image signal and a post-reset image signal from a respective pixel to said horizontal signal line via a common transfer path during the horizontal period, and wherein the noise canceling circuit takes a difference between the pre-reset image signal and the post-reset image signal.

2. The solid-state image sensor according to claim 1, wherein the vertical scanning circuit provides a transfer pulse and a pixel select pulse.

3. A method of driving a solid-state image sensor having a plurality of pixels arranged in a matrix of rows and columns, each pixel including a photoelectric conversion element, a floating diffusion, a transfer element for transferring a signal charge stored in said photoelectric conversion element to the floating diffusion, an amplifying element connected to the floating diffusion, a pixel select element connected to the amplifying element, the pixel element for selecting output of said signal charge, and a reset element connected to said floating diffusion, the reset element for resetting said floating diffusion, the method comprising the steps of:

providing a reset pulse to the reset element from a horizontal scanning circuit;

delivering a pre-reset image signal and a post-reset image signal from each unit pixel and transferring such signals via a common transfer path to a noise canceling circuit disposed at an end of the common transfer path, the reset pulse beginning after a start of a horizontal select pulse and ending before an end of the horizontal select pulse, effecting transfer of the pre-reset image signal and the post-reset image signal from a respective pixel to the noise canceling circuit during the horizontal period; and taking the difference between the pre-reset signal and the post reset signal at the noise canceling circuit.

4. A solid-state image sensor comprising:

a plurality of pixels arranged in a matrix of rows and columns, each pixel having:

a photoelectric conversion element, a floating diffusion, a transfer gate for transferring a signal charge stored in said photoelectric conversion element to the floating diffusion, an amplifying element connected to the floating diffusion, a pixel select element connected to the amplifying element, the pixel select element for selecting output of said signal charge, a reset gate connected to said floating diffusion, the reset gate for resetting said floating diffusion, the reset gate receiving a reset pulse from a horizontal scanning circuit, and a transfer control element for controlling an electrode of said transfer gate, wherein the horizontal scanning circuit provides a reset pulse to the reset gate and a horizontal select pulse to the transfer control element each during a horizontal period, the reset pulse beginning after a start of the horizontal select pulse and ending before an end of the horizontal select pulse, effecting transfer of a pre-reset image signal and a post-reset image signal from a respective pixel to a noise canceling circuit during the horizontal period, and wherein the noise canceling circuit takes a difference between the pre-reset image signal and the post-reset image signal.

5. A solid-state image sensor comprising:

a plurality of pixels arranged in a matrix of rows and columns, each pixel having:

a photoelectric conversion element, a floating diffusion, a transfer gate for transferring a signal charge stored in said photoelectric conversion element to the floating diffusion, an amplifying element connected to the floating diffusion, a pixel select element disposed between the amplifying element and an output signal line, the pixel select element for selecting output of said signal charge, a reset gate connected to said floating diffusion, the reset gate for resetting said floating diffusion, and a transfer control element connected to the transfer gate, the transfer control element receiving a vertical read scanning pulse from a vertical scanning circuit and a horizontal read scanning pulse from a horizontal scanning circuit, wherein the horizontal scanning circuit provides a reset pulse to the reset gate and the horizontal read scanning pulse to the transfer control element each during a horizontal period, the reset pulse beginning after a start of the horizontal read scanning pulse and ending before an end of the horizontal read scanning pulse, effecting transfer of a pre-reset image signal and a post-reset image signal from a respective pixel to a noise canceling circuit during the horizontal period, and wherein the noise canceling circuit takes a difference between the pre-reset image signal and the post-reset image signal.

6. A solid-state image sensor according to claim 5, wherein the transfer control element includes a read control transistor and a read transistor.

7. A solid-state image sensor comprising:

a plurality of pixels arranged in a matrix of rows and columns, each pixel having:

a photoelectric conversion element, a floating diffusion, a transfer element for transferring a signal charge stored in said photoelectric conversion element to the floating diffusion, an amplifying element connected to the floating diffusion, a pixel select element connected to the amplifying element, the pixel select element for selecting output of said signal charge, and a reset element connected to said floating diffusion, the reset element for resetting said floating diffusion;

a vertical scanning circuit;

a horizontal scanning circuit;

a vertical signal line connected to an output of said pixel select element;

a horizontal signal line connected to said vertical signal line via a horizontal select switch, the horizontal signal line for outputting a signal; and a noise canceling circuit connected to one end of the horizontal signal line, wherein the horizontal scanning circuit provides a reset pulse to the reset gate and a horizontal select pulse to the transfer control element each during a horizontal period, the reset pulse beginning after a start of the horizontal select pulse and ending before an end of the horizontal select pulse, effecting transfer of a pre-reset image signal and a post-reset image signal from a respective pixel to a noise canceling circuit during the horizontal period, and wherein the noise canceling circuit takes a difference between the pre-reset image signal and the post-reset image signal.

* * * * *